US011435394B1

(12) United States Patent
Noujeim et al.

(10) Patent No.: US 11,435,394 B1
(45) Date of Patent: Sep. 6, 2022

(54) ACCELERATED MEASUREMENTS THROUGH ADAPTIVE TEST PARAMETER SELECTION

(71) Applicant: ANRITSU COMPANY, Morgan Hill, CA (US)

(72) Inventors: Karam Noujeim, Los Altos, CA (US); Thomas Roberts, Morgan Hill, CA (US); Matthew Thomas, Santa Barbara, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 15/419,733

(22) Filed: Jan. 30, 2017

Related U.S. Application Data

(60) Provisional application No. 62/288,300, filed on Jan. 28, 2016.

(51) Int. Cl.
G01R 31/28 (2006.01)
G01R 23/16 (2006.01)
(52) U.S. Cl.
CPC ......... G01R 31/2832 (2013.01); G01R 23/16 (2013.01)
(58) Field of Classification Search
CPC .... G01R 23/16; G01R 31/2382; G01R 23/18; G06F 13/00; G01N 21/00; G01N 22/00
(Continued)

(56) References Cited

U.S. PATENT DOCUMENTS 3,916,319 A * 10/1975 Hawley, Jr ............. G01R 23/18
455/161.1
5,801,525 A 9/1998 Oldfield
(Continued)

OTHER PUBLICATIONS

Akmal, M. et al., "An Enhanced Modulated Waveform Measurement System for the Robust Characterization of Microwave Devices under Modulated Excitation", Proceedings of the 6th European Microwave Integrated Circuits Conference, ©2011, Oct. 2011, Manchester, UK, pp. 180-183.
(Continued)

Primary Examiner — Steven L Yeninas
(74) Attorney, Agent, or Firm — Kilpatrick Townsend & Stockton, LLP

(57) ABSTRACT

A method for measuring electrical response of a DUT includes using a measurement instrument, generating a radio frequency (RF) test signal via the measurement instrument at one or more initial frequencies, propagating the RF test signal at the one or more initial frequencies to the DUT, measuring a response of the DUT at the one or more initial frequencies and aggregating the measured response of the DUT at the one or more initial frequencies as response measurement data. The method then includes iteratively performing, until characterization of the DUT achieves a minimum criterion, the steps of adaptively selecting an additional frequency at which to generate a RF test signal based on the response measurement data based on a predetermined adaptive frequency algorithm, generating the RF test signal at the adaptively selected additional frequency, measuring a response of the DUT at the adaptively selected additional frequency, and adding the measured response of the DUT at the adaptively selected additional frequency to the response measurement data.

15 Claims, 5 Drawing Sheets

(58) Field of Classification Search
USPC .......... 324/76.19; 702/75; 714/37, 735, 736,
714/737, 47
See application file for complete search history.

(56) References Cited

U.S. PATENT DOCUMENTS

| | | | |
|---|---|---|---|
| 5,812,039 A | 9/1998 | Oldfield | |
| 5,909,192 A | 6/1999 | Finch | |
| 5,977,779 A | 11/1999 | Bradley | |
| 6,049,212 A | 4/2000 | Oldfield | |
| 6,065,137 A * | 5/2000 | Dunsmore | G01R 27/28 |
| | | | 356/73.1 |
| 6,291,984 B1 | 9/2001 | Wong | |
| 6,316,945 B1 | 11/2001 | Kapetanic | |
| 6,331,769 B1 | 12/2001 | Wong | |
| 6,496,353 B1 | 12/2002 | Chio | |
| 6,504,449 B2 | 1/2003 | Constantine | |
| 6,509,821 B2 | 1/2003 | Oldfield | |
| 6,525,631 B1 | 2/2003 | Oldfield | |
| 6,529,844 B1 | 3/2003 | Kapetanic | |
| 6,548,999 B2 | 4/2003 | Wong | |
| 6,650,123 B2 | 11/2003 | Martens | |
| 6,665,628 B2 | 12/2003 | Martens | |
| 6,670,796 B2 | 12/2003 | Mori | |
| 6,680,679 B2 | 1/2004 | Stickle | |
| 6,700,366 B2 | 3/2004 | Truesdale | |
| 6,700,531 B2 | 3/2004 | Abou-Jaoude | |
| 6,714,898 B1 | 3/2004 | Kapetanic | |
| 6,766,262 B2 | 7/2004 | Martens | |
| 6,832,170 B2 | 12/2004 | Martens | |
| 6,839,030 B2 | 1/2005 | Noujeim | |
| 6,882,160 B2 | 4/2005 | Martens | |
| 6,888,342 B2 | 5/2005 | Bradley | |
| 6,894,581 B2 | 5/2005 | Noujeim | |
| 6,917,892 B2 | 7/2005 | Bradley | |
| 6,928,373 B2 | 8/2005 | Martens | |
| 6,943,563 B2 | 9/2005 | Martens | |
| 7,002,517 B2 | 2/2006 | Noujeim | |
| 7,011,529 B2 | 3/2006 | Oldfield | |
| 7,016,024 B2 | 3/2006 | Bridge | |
| 7,019,510 B1 | 3/2006 | Bradley | |
| 7,054,776 B2 | 5/2006 | Bradley | |
| 7,068,046 B2 | 6/2006 | Martens | |
| 7,088,111 B2 | 8/2006 | Noujeim | |
| 7,108,527 B2 | 9/2006 | Oldfield | |
| 7,126,347 B1 | 10/2006 | Bradley | |
| 7,284,141 B2 | 10/2007 | Stickle | |
| 7,304,469 B1 | 12/2007 | Bradley | |
| 7,307,493 B2 | 12/2007 | Feldman | |
| 7,509,107 B2 | 3/2009 | Bradley | |
| 7,511,496 B2 * | 3/2009 | Schiano | G01R 33/34053 |
| | | | 324/307 |
| 7,511,577 B2 | 3/2009 | Bradley | |
| 7,521,939 B2 | 4/2009 | Bradley | |
| 7,545,151 B2 | 6/2009 | Martens | |
| 7,683,602 B2 | 3/2010 | Bradley | |
| 7,683,633 B2 | 3/2010 | Noujeim | |
| 7,705,582 B2 | 4/2010 | Noujeim | |
| 7,746,052 B2 | 6/2010 | Noujeim | |
| 7,764,141 B2 | 7/2010 | Noujeim | |
| 7,872,467 B2 | 1/2011 | Bradley | |
| 7,924,024 B2 | 4/2011 | Martens | |
| 7,957,462 B2 | 6/2011 | Aboujaoude | |
| 7,983,668 B2 | 7/2011 | Tiernan | |
| 8,027,390 B2 | 9/2011 | Noujeim | |
| 8,058,880 B2 | 11/2011 | Bradley | |
| 8,145,166 B2 | 3/2012 | Barber | |
| 8,156,167 B2 | 4/2012 | Bradley | |
| 8,159,208 B2 | 4/2012 | Brown | |
| 8,169,993 B2 | 5/2012 | Huang | |
| 8,185,078 B2 | 5/2012 | Martens | |
| 8,278,944 B1 | 10/2012 | Noujeim | |
| 8,294,469 B2 | 10/2012 | Bradley | |
| 8,305,115 B2 | 11/2012 | Bradley | |
| 8,306,134 B2 | 11/2012 | Martens | |
| 8,313,437 B1 * | 11/2012 | Suri | A61B 8/0858 |
| | | | 382/128 |
| 8,410,786 B1 | 4/2013 | Bradley | |
| 8,417,189 B2 | 4/2013 | Noujeim | |
| 8,457,187 B1 | 6/2013 | Aboujaoude | |
| 8,493,111 B1 | 7/2013 | Bradley | |
| 8,498,582 B1 | 7/2013 | Bradley | |
| 8,593,158 B1 | 11/2013 | Bradley | |
| 8,629,671 B1 | 1/2014 | Bradley | |
| 8,630,591 B1 | 1/2014 | Martens | |
| 8,666,322 B1 | 3/2014 | Bradley | |
| 8,718,586 B2 | 5/2014 | Martens | |
| 8,760,148 B1 | 6/2014 | Bradley | |
| 8,816,672 B1 | 8/2014 | Bradley | |
| 8,816,673 B1 | 8/2014 | Barber | |
| 8,884,664 B1 | 11/2014 | Bradley | |
| 8,903,149 B1 | 12/2014 | Noujeim | |
| 8,903,324 B1 | 12/2014 | Bradley | |
| 8,942,109 B2 | 1/2015 | Dorenbosch | |
| 9,103,856 B2 | 8/2015 | Brown | |
| 9,103,873 B1 | 8/2015 | Martens | |
| 9,176,174 B1 | 11/2015 | Bradley | |
| 9,176,180 B1 | 11/2015 | Bradley | |
| 9,210,598 B1 | 12/2015 | Bradley | |
| 9,239,371 B1 | 1/2016 | Bradley | |
| 9,287,604 B1 | 3/2016 | Noujeim | |
| 9,331,633 B1 | 5/2016 | Robertson | |
| 9,366,707 B1 | 6/2016 | Bradley | |
| 9,455,792 B1 | 9/2016 | Truesdale | |
| 9,560,537 B1 | 1/2017 | Lundquist | |
| 9,571,142 B2 | 2/2017 | Huang | |
| 9,588,212 B1 | 3/2017 | Bradley | |
| 9,594,370 B1 | 3/2017 | Bradley | |
| 9,606,212 B1 | 3/2017 | Martens | |
| 9,696,403 B1 | 7/2017 | Elder-Groebe | |
| 9,733,289 B1 | 8/2017 | Bradley | |
| 9,753,071 B1 | 9/2017 | Martens | |
| 9,768,892 B1 | 9/2017 | Bradley | |
| 9,860,054 B1 | 1/2018 | Bradley | |
| 9,964,585 B1 | 5/2018 | Bradley | |
| 9,967,085 B1 | 5/2018 | Bradley | |
| 9,977,068 B1 | 5/2018 | Bradley | |
| 10,003,453 B1 | 6/2018 | Bradley | |
| 10,006,952 B1 | 6/2018 | Bradley | |
| 10,064,317 B1 | 8/2018 | Bradley | |
| 10,116,432 B1 | 10/2018 | Bradley | |
| 2006/0250135 A1 | 11/2006 | Buchwald et al. | |
| 2010/0207620 A1 * | 8/2010 | Gies | G01N 27/9033 |
| | | | 324/240 |
| 2011/0037667 A1 | 2/2011 | Varjonen et al. | |
| 2012/0100636 A1 * | 4/2012 | Johal | G01N 29/036 |
| | | | 436/501 |
| 2013/0016243 A1 * | 1/2013 | Foote | H04N 5/23212 |
| | | | 348/222.1 |
| 2013/0063299 A1 * | 3/2013 | Proudkii | G01S 7/024 |
| | | | 342/188 |
| 2014/0240605 A1 * | 8/2014 | Basawapatna | G01R 23/165 |
| | | | 348/725 |
| 2016/0050032 A1 | 2/2016 | Emerson et al. | |
| 2016/0290855 A1 * | 10/2016 | Rhoads | G01H 13/00 |
| 2017/0030954 A1 * | 2/2017 | Whatmough | G01R 23/07 |
| 2017/0038311 A1 * | 2/2017 | Conrad | G01N 22/00 |

OTHER PUBLICATIONS

Cunha, Telmo R. et al., "Characterizing Power Amplifier Static AM/PM with Spectrum Analyzer Measurements", IEEE ©2014, 4 pages.

Fager, Christian et al., "Prediction of Smart Antenna Transmitter Characteristics Using a New Behavioral Modeling Approach" IEEE ©2014, 4 pages.

Fager, Christian et al., "Analysis of Nonlinear Distortion in Phased Array Transmitters" 2017 International Workshop on Integrated Nonlinear Microwave and Millmetre-Wave Circuits (INMMiC), Apr. 20-21, 2017, Graz, Austria, 4 pages.

(56) References Cited

OTHER PUBLICATIONS

Martens, J. et al., "Towards Faster, Swept, Time-Coherent Transient Network Analyzer Measurements" 86th ARFTG Conf. Dig., Dec. 2015, 4 pages.

Martens, J., "Match correction and linearity effects on wide-bandwidth modulated AM-AM and AM-PM measurements" 2016 EuMW Conf. Dig., Oct. 2016, 4 pages.

Nopchinda, Dhecha et al., "Emulation of Array Coupling Influence on RF Power Amplifiers in a Measurement Setup", IEEE ©2016, 4 pages.

Pedro, Jose Carlos et al., "On the Use of Multitone Techniques for Assessing RF Components' Intermodulation Distortion", IEEE Transactions On Microwave Theory and Techniques, vol. 47, No. 12, Dec. 1999, pp. 2393-2402.

Ribeiro, Diogo C. et al., "D-Parameters: A Novel Framework for Characterization and Behavorial Modeling of Mixed-Signal Systems", IEEE Transactions On Microwave Theory and Techniques, vol. 63, No. 10, Oct. 2015, pp. 3277-3287.

Roblin, Patrick, "Nonlinear RF Circuits and Nonlinear Vector Network Analyzers; Interactive Measurement and Design Techniques", The Cambridge RF and Microwave Engineering Series, Cambridge University Press ©2011, entire book.

Rusek, Fredrik et al., "Scaling Up MIMO; Opportunities and challenges with very large arrays", IEEE Signal Processing Magazine, Jan. 2013, pp. 40-60.

Senic, Damir et al., "Estimating and Reducing Uncertainty in Reverberation-Chamber Characterization at Millimeter-Wave Frequencies", IEEE Transactions On Antennas and Propagation, vol. 64, No. 7, Jul. 2016, pp. 3130-3140.

Senic, Damir et al., "Radiated Power Based on Wave Parameters at Millimeter-wave Frequencies for Integrated Wireless Devices", IEEE ©2016, 4 pages.

\* cited by examiner

ACCELERATED MEASUREMENTS THROUGH ADAPTIVE TEST PARAMETER SELECTION

CLAIM OF PRIORITY

This application claims the benefit of priority to U.S. Provisional Application titled "ACCELERATED NETWORK ANALYZER MEASUREMENTS THROUGH ADAPTIVE FREQUENCY SWEEP", Application No. 62/288,300, filed Jan. 28, 2016, which application is herein incorporated by reference.

TECHNICAL FIELD

The present invention relates generally to measurement instruments and methods for performing measurements on devices under test (DUTs).

BACKGROUND

Measurement instruments are often employed to measure properties or performance of a device under test (DUT). For example, network analyzers can be used to measure the frequency response of a DUT comprising an electrical network, component, circuit, or sub-assembly to determine network parameters and characteristics such as noise performance. Measurement instruments can also be used to identify the presence and sometimes the location of defects within a DUT. For example, passive intermodulation (PIM) measurement instruments can be used to identify sources of passive intermodulation in an electrical network, component, circuit, or sub-assembly. A DUT is not limited to electrical networks and components. A millimeter wave scanner is an imaging device that images people, targeting objects concealed underneath a person's clothing using electromagnetic radiation.

Such measurement instruments commonly perform measurements according to a test plan that comprise stepwise progression through the test plan. For example, network analyzers will perform a frequency sweep, stepping from a starting frequency and proceeding to an end frequency at steps of some delta frequency. Such test plans can be time consuming and energy intensive.

SUMMARY

In accordance with embodiments, a system and method for measuring electrical response of a DUT includes using a measurement instrument, generating a radio frequency (RF) test signal via the measurement instrument at one or more initial frequencies, propagating the RF test signal at the one or more initial frequencies to the DUT, measuring a response of the DUT at the one or more initial frequencies and aggregating the measured response of the DUT at the one or more initial frequencies as response measurement data. The method then includes iteratively performing, until characterization of the DUT achieves a minimum criterion, the steps of adaptively selecting an additional frequency at which to generate a RF test signal based on the response measurement data based on a predetermined adaptive frequency algorithm, generating the RF test signal at the adaptively selected additional frequency, measuring a response of the DUT at the adaptively selected additional frequency, and adding the measured response of the DUT at the adaptively selected additional frequency to the response measurement data.

In accordance with an embodiment, the adaptive frequency algorithm determines an initial frequency and thereafter determines succeeding frequencies based on the response of the DUT measured at the preceding frequency. Optionally, the adaptive frequency algorithm takes input from single-frequency measurements and determines whether to zoom-in on portions of a frequency range based on a rate of change of a response and termination criteria.

In accordance with an embodiment, the measurement instrument includes a field-programmable gate array (FPGA). The FPGA applies the adaptive frequency algorithm to determine the plurality of frequencies.

BRIEF DESCRIPTION OF THE DRAWINGS

Further details of the present invention are explained with the help of the attached drawings in which.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout.

It would be apparent to one of skill in the art that the present invention, as described below, may be implemented in many different embodiments of hardware, software, firmware, and/or the entities illustrated in the figures. Further, the frequencies given for signals generated and/or used, and the values for electronic components in the figures and description are merely exemplary. Any actual software, firmware and/or hardware described herein, as well as any frequencies of signals generated thereby and any values for electronic components, are not limiting of the present invention. Thus, the operation and behavior of the present invention will be described with the understanding that modifications and variations of the embodiments are possible, given the level of detail presented herein.

Embodiments of systems and methods in accordance with the present invention are intended to be applicable to many different measurement instrument types that perform various different tests on devices under test (DUTs). However, merely for purposes of illustration embodiments will be described in their application to a vector network analyzer (VNA). It will be understood by one skilled in the art that embodiments of systems and methods discussed herein are not intended to be limited in their application to VNAs or those other measurement instruments discussed herein.

Figure 1:
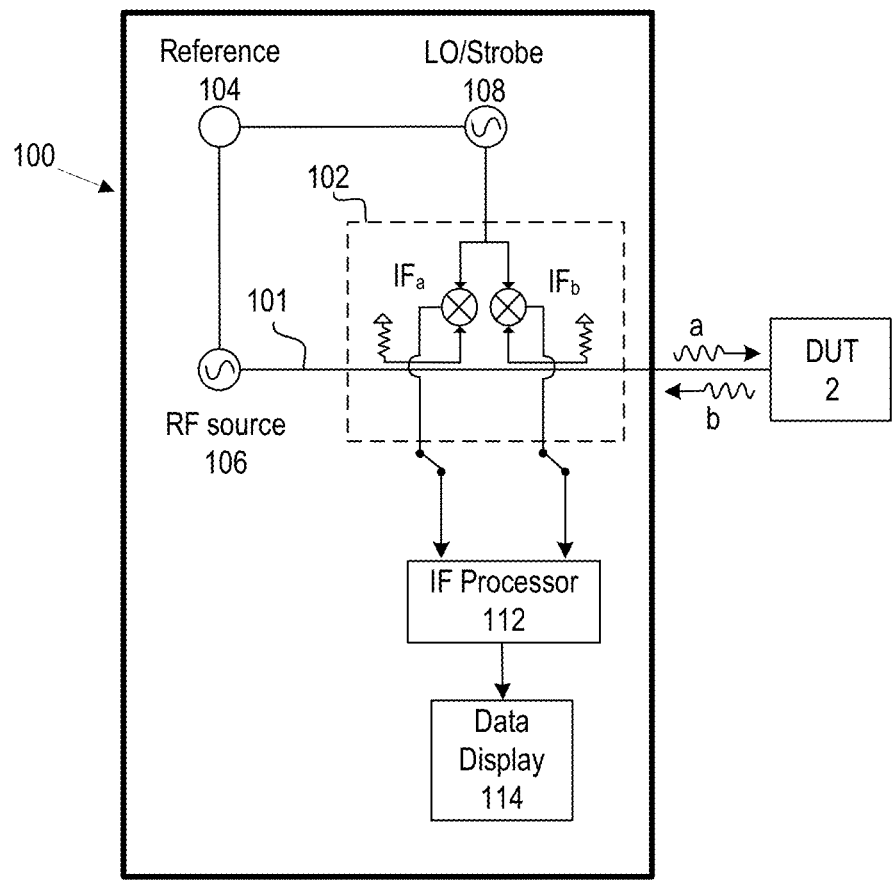
FIG. 1 illustrates an exemplary measurement instrument for measuring electrical response of a device under test (DUT), in accordance with the prior art.

For purposes of explaining embodiments of the present invention, FIG. 1 is provided illustrating a VNA 100 connected to a DUT 2, in accordance with the prior art. VNAs are typically used to characterize a DUT, such as an antenna system for a telecommunication network, using frequency domain reflectometry techniques. The VNA 100 makes use of a reflectometer receiver 102 for signal separation and detection. The directional couplers divert signal power from a main line 101 to which they are coupled. These couplers separate the waves that are incident on and reflected from the DUT 2. The reflectometer receiver 102 uses a local oscillator (LO) 108 to mix a radio frequency (RF) signal or stimulus from the RF source 106 down to a lower intermediate frequency (IF) signal. A frequency reference 104 acts as a stable oscillator that can be used for frequency calibration or reference. The LO 108 is either phase-locked to the RF or the IF signal so that the reflectometer receiver 102 is tuned to the RF signal present at the RF source 106. The incident wave and related signal paths are indicated by an "a" and the reflected wave and related signal paths are indicated by a "b". The IF signals (IFa, IFb) can be provided to a processor 112 for signal conditioning and provided to a data display 114 for displaying the amplitude and phase information obtained from the IF signals.

RF test signals are generated by the VNA and propagated to a DUT and provide the ability to locate changes and degradations at the frequency of operation. In accordance with the prior art, a DUT is analyzed by performing a frequency sweep and measuring the response of the DUT at each of a plurality of frequencies. Frequency sweeps are performed and response measurement data are analyzed in the frequency domain to enable users to address changes or degradations before they result in severe failures. Parameters of a frequency sweep (also referred to herein as a test plan) can be generated based on input from a user. Input includes a start frequency and an end frequency. Input can also include, for example, a desired number of measurements between the start and end frequencies, or a desired noise bandwidth at 3 dB, for example. One parameter of the test plan is frequency step. When the test plan is executed and the frequency sweep is performed, test signals are generated at the start frequency and at each frequency subsequent frequency according to the frequency step until the end frequency is reached.

Figure 2A:
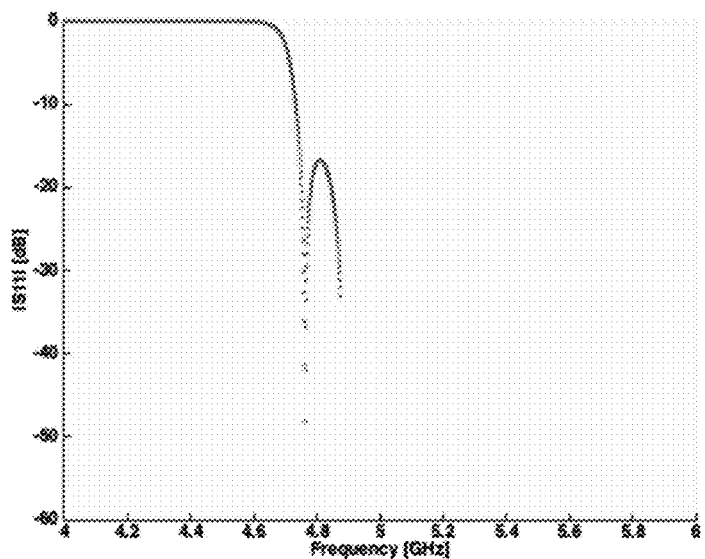
FIGS. 2A and 2B illustrate a frequency swept measurement of a scattering parameter, in accordance with the prior art.
Figure 2A:
Figure 2B:
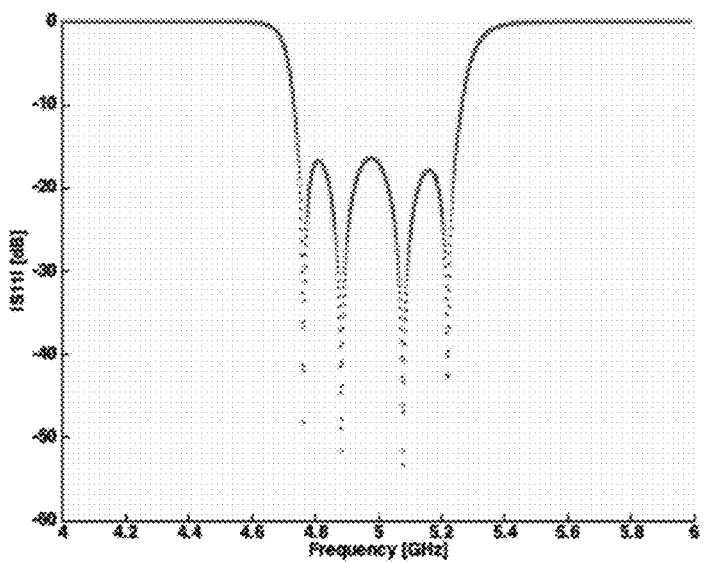
Figure 2B:
Figure 3A:
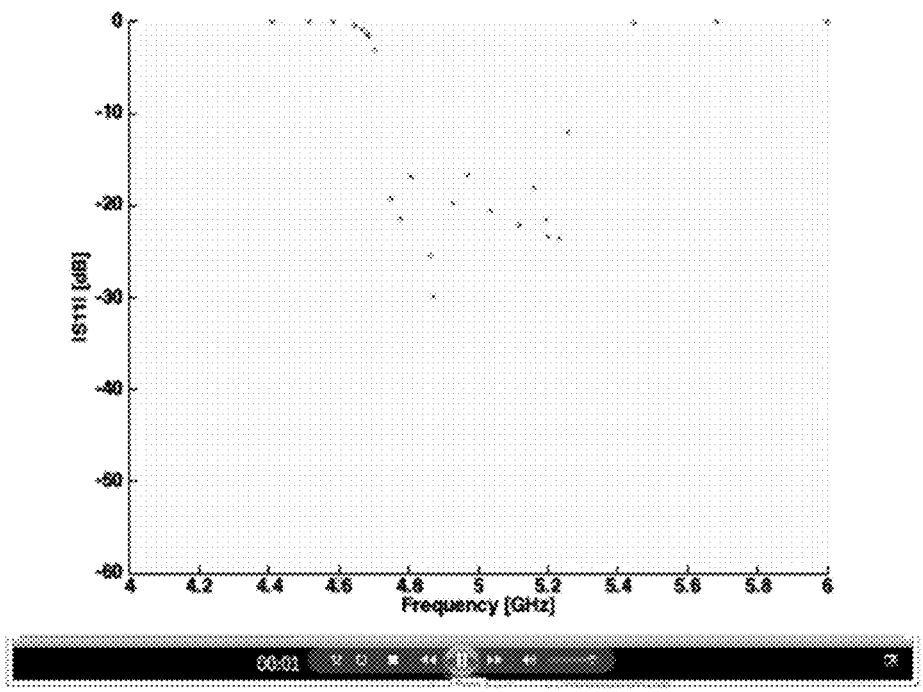
FIGS. 3A-3D illustrate a frequency swept measurement of a scattering parameter, in accordance with an embodiment.
Figure 3B:
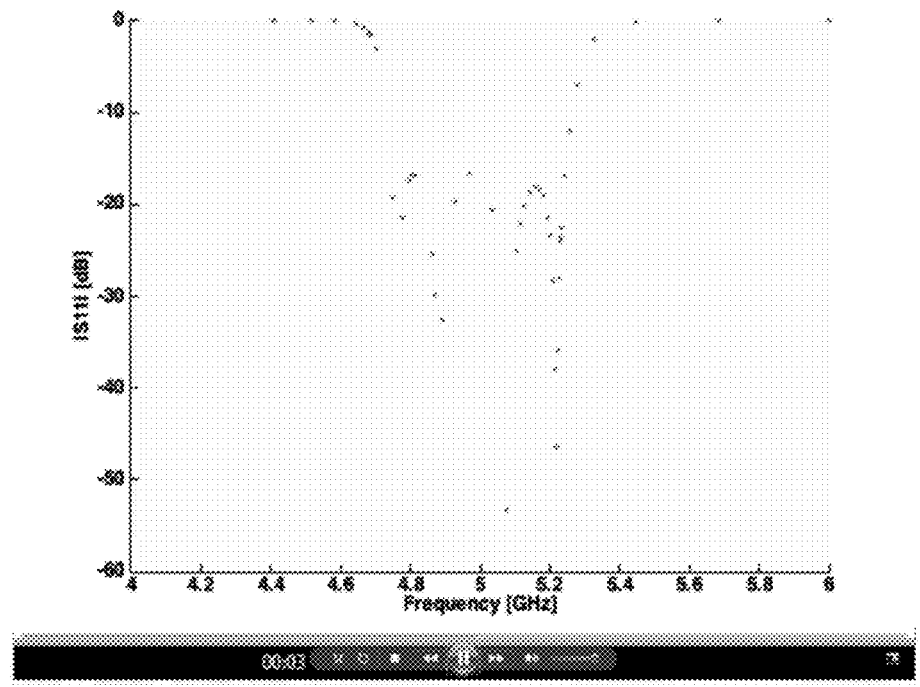
Figure 3C:
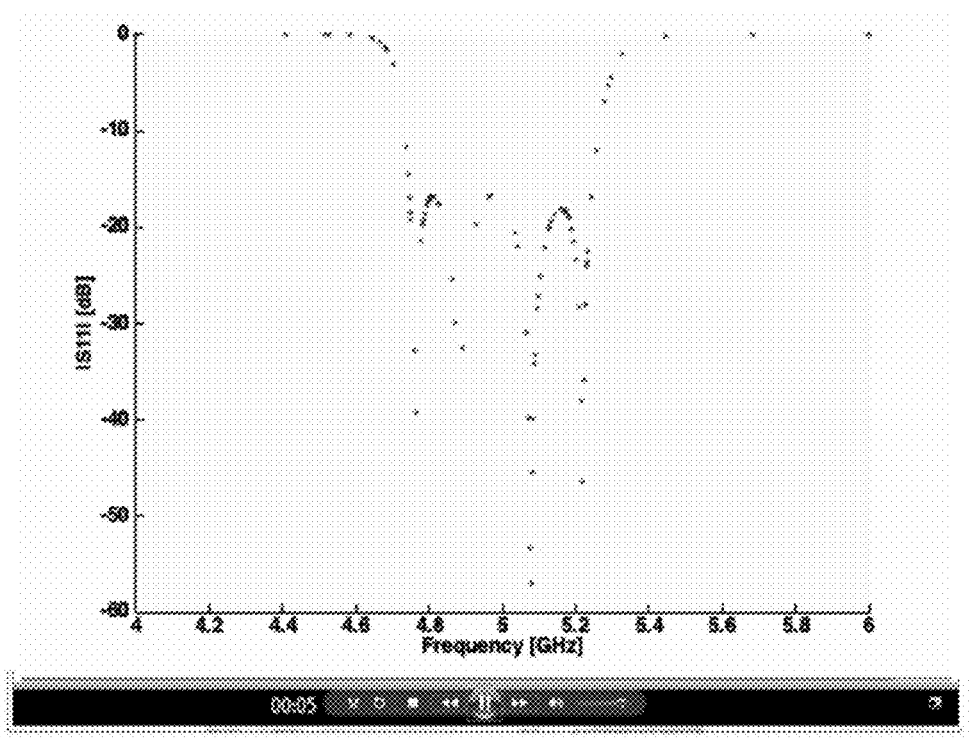
Figure 3D:
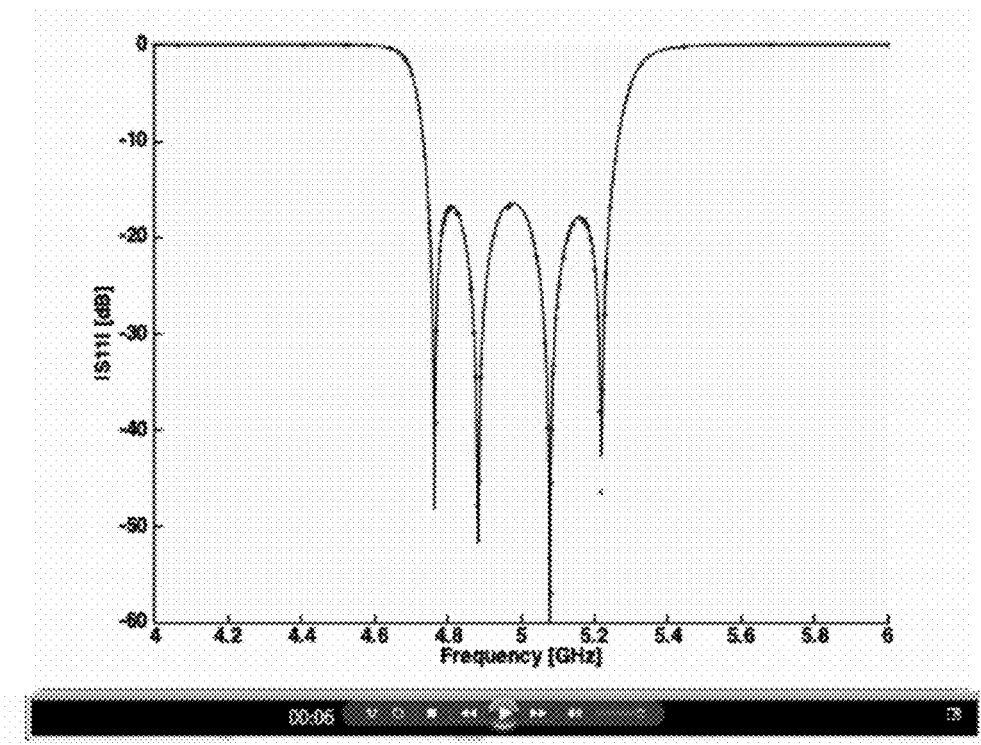

FIGS. 2A and 2B illustrate an exemplary frequency swept measurement of a DUT, in accordance with the prior art. As can be seen, the measurement instrument (e.g., a VNA) steps through the frequencies progressively, obtaining S-parameter measurements (in this case the |S11| parameter) in decibels. As shown, this step-wise, linear progression takes over two minutes to complete the frequency swept measurements. However, the timing of the frequency swept measurement is merely exemplary and will depend largely on the number of points used in a traditional sweep. A traditional sweep becomes slower as more points are requested.

For a given frequency step, IF bandwidth, and number of averages, frequency-swept network analyzer measurements are speed-limited by the measurement time per frequency. While the measurement time per frequency can be reduced to a certain degree by software optimization, sophisticated and potentially costly hardware is often required to reduce it by an order of magnitude or more. Segmented frequency sweeps are often used as a cheap alternative to accelerate the measurements, but assume a priori knowledge of a DUT's behavior as a function of frequency, a quantity that is often not readily available.

In accordance with an embodiment, systems and methods can apply adaptive algorithms to frequency sweeps to reduce a time required to obtain measurements of a DUT. Rather than performing frequency sweeps according to a test plan in a step-wise, linear progression, embodiments of systems and methods select, generate, and measure response to test signals at frequencies within the frequency sweep selected in an adaptive fashion. The adaptive algorithm changes the parameters of the test plan based on the analysis of response measurement data obtained in response to the test signals. In an embodiment, the algorithm can be based on a technique of subdividing the frequency interval in sections while monitoring the response measurement data and avoiding dwelling on frequencies proximate to frequencies where the response measurement data is not changing much. In monitoring response measurement data, gradient, derivate-based techniques can be applied, for example, to monitor slope and changes in slope.

In an embodiment, analysis of the response measurement data can be performed by computation, for example, between frequency steps and a determination can be made for the next frequency at which a test signal is to be generated and transmitted based on that response measurement data and optionally on previous response measurement data. Adaptive algorithms have been used in simulation software to speed simulations. However, they have not been applied or been recognized to be applicable to measurements performed on DUTs by measurement instruments.

FIGS. 3A-3D illustrate an exemplary frequency swept measurement, in accordance with an embodiment. The frequency swept measurement uses an adaptive frequency sweep to determine frequencies at which to obtain measurements. A method applying an adaptive frequency sweep can be used to accelerate frequency sweeps in measurement instruments (e.g., VNAs). In an embodiment, a system comprises one or more field-programmable gate arrays (FPGAs), fast adaptive algorithms with little overhead, and hardware settings in the measurement instrument that are used in together to achieve effective sweep speeds that are unmatched by measurement instruments applying traditional frequency sweep measurements. The FPGA implementation of the algorithm determines the parameters of the frequency sweep and instructs the measurement instrument how to sweep. The FPGA implementation interacts with a measurement engine, collecting response measurement data from the measurement engine and determining what frequencies to select and generate test signals at based on the collected response measurement data.

A DUT can be measured at a small number of adaptively chosen, mainly non-equidistant frequencies that form a minimal frequency set. The response of the DUT is determined from the minimal frequency set and the corresponding response measurement data. It has been observed that the response of the DUT can be determined in a fraction of the time it takes using a traditional frequency sweep. The adaptive frequency sweep shown in FIGS. 3A-3D was performed on the DUT of FIGS. 2A and 2B in under 10 seconds.

Figure 4:
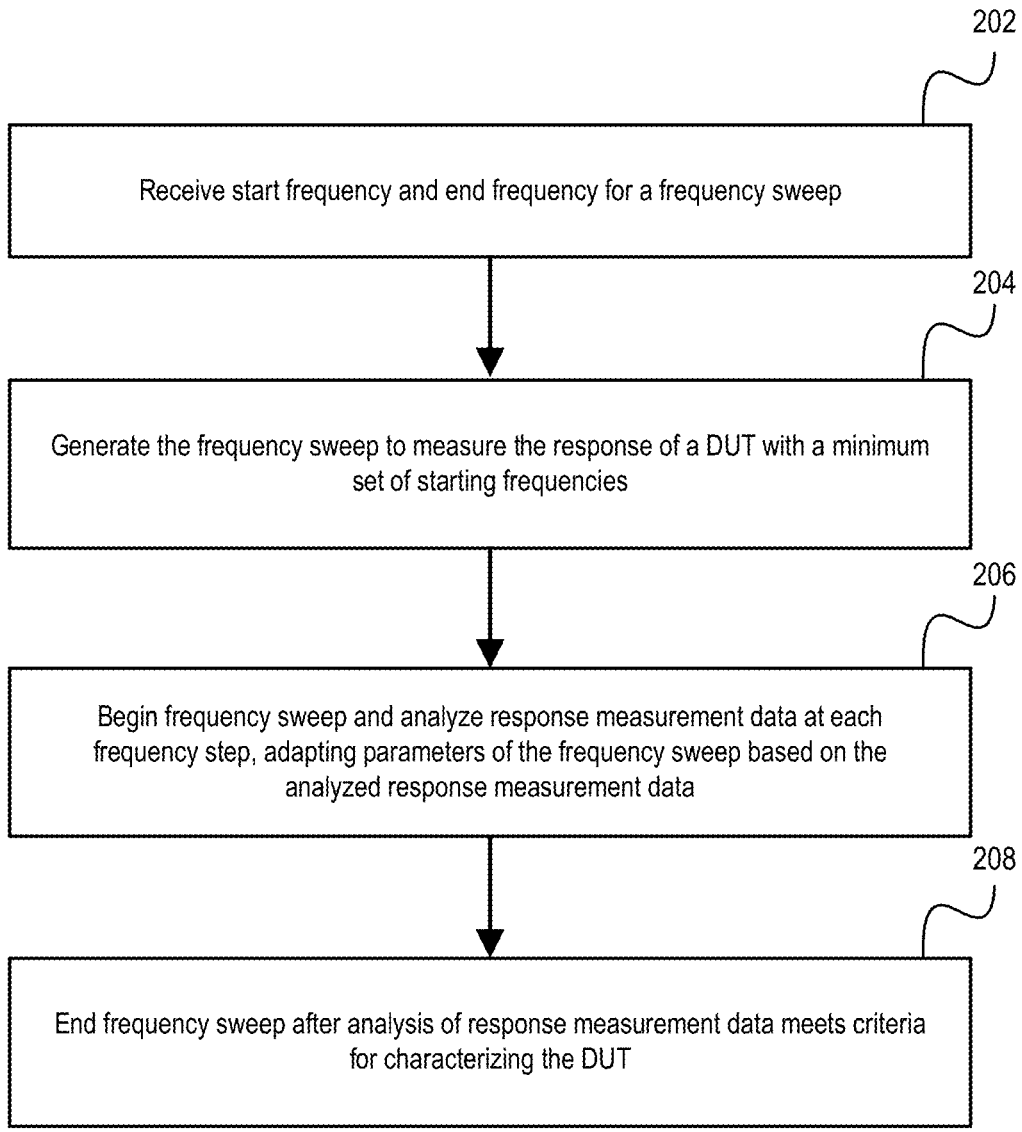
FIG. 4 is a flowchart for a method for measuring electrical response of a DUT using an adaptive frequency algorithm, in accordance with the present invention.

FIG. 4 is a flowchart for a method of measuring electrical response of a DUT, in accordance with an embodiment. The measurement instrument receives as input form a user a start frequency and end frequency for a frequency sweep (Step 202). The measurement instrument generates the frequency sweep to measure the response of a DUT with a minimum set of starting frequencies (Step 204). For example, the frequency sweep can comprise generating a test signal at the start frequency and at the end frequency, and then can begin to implement subdivision of the frequencies, monitoring for changes in the response measurement data. The measurement instrument can analyze response measurement data at each frequency step, adapting parameters of the frequency sweep based on the analyzed response measurement data (Step 206). The frequency sweep can be ended after analysis of response measurement data meets criteria for characterizing the DUT (Step 208). Conditions can be set on the algorithm at which the frequency sweep can terminate based on a resolution of the response measurement data and frequency delta. For example, a frequency step can comprise a minimum delta between test frequencies. Similarly, response measurement data can be gated. Uncertainty in measurement can be used to set limitations on the frequency sweep, for example.

An adaptive frequency sweeping algorithm can be derived, for example, from adaptive algorithms used in electromagnetic field simulators. Algorithms for implementing adaptive techniques used in simulation software are highly proprietary and are typically non-FPGA based.

In accordance with an embodiment, systems and methods can apply an algorithm that takes its input from single-frequency measurements and decides whether to zoom-in on portions of the frequency range or not, for example based on the rate of change of a response and the termination criteria imposed. Execution time for an algorithm can be reduced considerably by exploiting parallelism in an FPGA implementation. The algorithm can be recursive, or alternatively iterative for implementation in an FPGA.

In an embodiment, for example where memory requirements limit the amount of data that can be collected in a fully recursive algorithm, the recursive algorithm can be unwrapped to run in a sequential fashion, thereby unburdening the memory requirements for the FPGA of the measurement instrument.

Systems and methods in accordance with embodiments can provide fast frequency sweeps, fast effective measurement per frequency, response availability at an unlimited number of points in a frequency range, fast display and refresh of DUT response, and reduced hardware cost and complexity.

Systems and methods in accordance with an embodiment can provide enhanced measurement throughput, and can be used in a variety of environments, including manufacturing environments, to measure signal integrity, for filter tuning, for time gating. System and methods in accordance with alternative embodiments can further be used in a variety of other applications, for example, in millimeter (mm-) wave airport security scanners, product differentiation, etc.

The foregoing description of the present invention has been provided for the purposes of illustration and description. It is not intended to be exhaustive or to limit the invention to the precise forms disclosed. Many modifications and variations will be apparent to the practitioner skilled in the art. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalents.

The invention claimed is:

1. A measurement instrument for measuring electrical response of a Device Under Test (DUT), the measurement instrument comprising:
   a processor;
   a field-programmable gate array (FPGA);
   an RF source;
   an RF receiver; and
   wherein the measurement instrument is configured to
   receive user input defining a start frequency and an end frequency for a frequency sweep;
   generate a radio frequency (RF) test signal at one or more initial frequencies, between the start frequency and end frequency, using the RF source;
   propagate the RF test signal at the one or more initial frequencies to the DUT;
   measure, via the RF receiver, a response of the DUT at the one or more initial frequencies;
   aggregate the response of the DUT measured by the RF receiver at the one or more initial frequencies as response measurement data;
   iteratively perform, a plurality of iterations, until characterization of the DUT achieves a minimum criterion, the steps of
      adaptively select an additional single frequency, between the start frequency and end frequency, at which to generate an additional RF test signal based on the response measurement data based on a predetermined adaptive frequency sweeping algorithm implemented on the FPGA;
      generate the additional RF test signal at the adaptively selected additional single frequency using the RF source;
      measure, via the RF receiver, a single-frequency response of the DUT at the adaptively selected additional single frequency;
      add the measured single-frequency response of the DUT to the response measurement data; and
      analyze the response measurement data, including the additional single-frequency response, to characterize the DUT and determine whether characterization of the DUT has achieved said minimum criterion; and
   terminate the plurality of iterations when analysis of the response measurement data achieves characterization of the DUT between the start frequency and end frequency meeting the minimum criterion.

2. The measurement instrument of claim 1, wherein the adaptive frequency sweeping algorithm determines the one or more initial frequencies and thereafter adaptively selects, for each iteration, the additional single frequency at which to generate an additional RF test signal based on the response measurement data.

3. The measurement instrument of claim 1, wherein the adaptive frequency sweeping algorithm takes input from single-frequency measurements and determines whether to zoom-in on portions of a frequency range based on a rate of change of a response and termination criteria.

4. The measurement instrument of claim 1, wherein the FPGA implementing the adaptive frequency sweeping algorithm collects response measurement data from the RF receiver which measures the response of the DUT at the one or more initial frequencies.

5. A method for measuring electrical response of a Device Under Test (DUT), comprising:
   providing a measurement instrument including an RF source, an RF receiver, a field programmable gate array (FPGA), and a processor;
   connecting the measurement instrument to the DUT;
   receiving user input defining a start frequency and an end frequency for a frequency sweep;
   generating a radio frequency (RF) test signal using the RF source of the measurement instrument at one or more initial frequencies between the start frequency and end frequency;

propagating the RF test signal at the one or more initial frequencies to the DUT;

measuring, via the RF receiver, a response of the DUT at the one or more initial frequencies;

aggregating the response of the DUT measured by the RF receiver at the one or more initial frequencies as response measurement data;

iteratively performing, a plurality of iterations, until characterization of the DUT achieves a minimum criterion, the steps of adaptively selecting an additional single frequency, between the start frequency and end frequency, at which to generate an additional RF test signal based on the response measurement data based on a predetermined adaptive frequency sweeping algorithm implemented on the FPGA;

generating the additional RF test signal at the adaptively selected additional single frequency using the RF source;

measuring, via the RF receiver, a single-frequency response of the DUT at the adaptively selected additional single frequency;

adding the measured single-frequency response of the DUT to the response measurement data; and analyze the response measurement data including the additional single-frequency response to characterize the DUT and determine whether characterization of the DUT has achieved said minimum criterion; and terminating the plurality of iterations when analysis of the response measurement data achieves characterization of the DUT between the start frequency and end frequency meeting the minimum criterion.

6. The method of claim 5, wherein the adaptive frequency sweeping algorithm determines the one or more initial frequencies and thereafter adaptively selects, for each iteration, the additional single frequency at which to generate an additional RF test signal based on the response measurement data.

7. The method of claim 5, wherein the adaptive frequency sweeping algorithm takes input from single-frequency measurements and determines whether to zoom-in on portions of a frequency range based on a rate of change of a response and termination criteria.

8. The method of claim 5, wherein the FPGA implementing the adaptive frequency sweeping algorithm collects response measurement data from the RF receiver which measures the response of the DUT at the one or more initial frequencies.

9. A measurement instrument for measuring electrical response of a Device Under Test (DUT) using a frequency sweep, the measurement instrument comprising:

a processor;

a field programmable gate array (FPGA), an RF source; and an RF receiver;

wherein the measurement instrument is configured to receive input from a user indicating a start frequency and an end frequency for the frequency sweep;

generate a radio frequency (RF) test signal at the start frequency and the end frequency using the RF source;

propagate the RF test signal at the start frequency and the end frequency to the DUT;

measure, via the RF receiver, a response of the DUT at the start frequency and the end frequency;

aggregate the response of the DUT measured by the RF receiver at the start frequency and the end frequency as response measurement data;

iteratively perform, a plurality of iterations, until characterization of the DUT achieves a minimum criterion, the steps of adaptively select an additional single frequency between the start frequency and end frequency at which to generate an additional RF test signal based on the response measurement data based on a predetermined adaptive frequency sweeping algorithm implemented on the FPGA;

generate the additional RF test signal at the adaptively selected additional single frequency using the RF source;

measure, via the RF receiver, a single-frequency response of the DUT at the adaptively selected additional single frequency;

add the measured single-frequency response of the DUT to the response measurement data; and analyze the response measurement data including the additional single-frequency response to characterize the DUT and determine whether characterization of the DUT has achieved said minimum criterion; and terminate performing the plurality of iterations when analysis of the response measurement data comprising all measured single frequency responses at all selected frequencies between the start frequency and the end frequency achieves characterization of the DUT between the start frequency and end frequency meeting the minimum criterion.

10. The measurement instrument of claim 9, wherein the adaptive frequency sweeping algorithm determines succeeding single additional frequencies based on the response of the DUT measured at the preceding frequency.

11. The measurement instrument of claim 9, wherein the adaptive frequency sweeping algorithm takes input from single-frequency measurements and determines whether to zoom-in on portions of a frequency range based on a rate of change of a response and termination criteria.

12. The measurement instrument of claim 9, wherein the FPGA implementing the adaptive frequency sweeping algorithm collects response measurement data from the RF receiver which measures the response of the DUT at the one or more initial frequencies.

13. The measurement instrument of claim 9, wherein the minimum criterion for completion of characterization of the DUT is specified based on resolution of the response measurement data.

14. The measurement instrument of claim 1, wherein the minimum criterion for completion of characterization of the DUT is specified based on resolution of the response measurement data and a delta between each additional frequency.

15. The method of claim 5, wherein the minimum criterion for completion of characterization of the DUT is specified based on a minimum delta between test frequencies.

* * * * *